United States Patent [19]

Narushima et al.

[11] Patent Number: 5,298,304
[45] Date of Patent: Mar. 29, 1994

[54] ADHESIVE TAPES FOR TAPE AUTOMATED BONDING

[75] Inventors: Hitoshi Narushima; Yoshikazu Tsukamoto; Tadahiro Oishi; Atsushi Koshimura, all of Shizuoka, Japan

[73] Assignee: Tomoegawa Paper Co., Ltd., Tokyo, Japan

[21] Appl. No.: 980,230

[22] Filed: Nov. 23, 1992

Related U.S. Application Data

[62] Division of Ser. No. 761,939, Sep. 20, 1991.

[30] Foreign Application Priority Data

Jan. 23, 1990 [JP] Japan ................................ 2-117444
Jan. 30, 1990 [JP] Japan ................................ 2-19265

[51] Int. Cl.$^5$ ............................................ C09J 7/02
[52] U.S. Cl. ........................................ 428/40; 428/355
[58] Field of Search .............. 428/40, 355, 474.4, 428/474.7, 474.9, 525

[56] References Cited

U.S. PATENT DOCUMENTS

4,400,229 8/1983 Demmer ........................... 428/524

FOREIGN PATENT DOCUMENTS

53-134365 11/1978 Japan.
53-149764 12/1978 Japan.
63-289823 11/1988 Japan.
2-15644 1/1990 Japan.

*Primary Examiner*—Jenna L. Davis
*Attorney, Agent, or Firm*—Finnegan, Henderson, Farabow, Garrett & Dunner

[57] ABSTRACT

This invention relates to an adhesive tape for tape automated bonding (TAB). A first type of the adhesive tape for TAB according to the invention has a protective film and an adhesive layer laminated on an organic-insulating film. This adhesive layer is characterized by comprising at least resol-type phenol resin and polyamide resin, wherein from 2 to 35% of said resol-type resin is contained in the adhesive layer. A second type of the adhesive tape for TAB according to the invention has a protective film and an adhesive layer laminated on an organic-insulating film. This adhesive layer is characterized by having at least two layers: one comprising at least polyamide resin and being laminated on one surface of said organic-insulating film and; other comprising at least polyamide resin and resol-type resin and being laminated on other surface of said protective film.

3 Claims, 2 Drawing Sheets

ADHESIVE TAPES FOR TAPE AUTOMATED BONDING

This is a division of application Ser. No. 07/761,939, filed Sep. 20, 1991 pending.

FIELD OF THE INVENTION

This invention relates to an adhesive tape for tape automated bonding (hereafter referred as TAB). The adhesive tape for TAB is processed into a tape carrier which is used in a process of manufacturing semiconductor devices, in particular, those devices requiring low-dimensional changes to suit high-pin count and fine-patterned devices.

DESCRIPTION OF PRIOR ART

Heretofore, the adhesive tapes for TAB have been processed into tape carriers by the method which comprises the following steps:

(1) punching the adhesive tape for TAB by stamping means to make a sprocket-device hole and removing a protective film from the punched tape;

(2) attaching copper foil on the removed portion of the punched tape by a thermocompression bonder and heating the copper-foil laminated tape to harden the adhesive therein;

(3) coating a photoresist on the copper-foil laminated tape, irradiating UV or the like through a mask to the photoresist, and developing the photoresist with a developer;

(4) backing the device-hole, etching the copper, eliminating the resist, de-backing the device-hole, coating a solder resist on the copper-foil laminated tape, and making a circuit on the copper-foil laminated tape; and (5) plating tin or gold on the tape to obtain a tape carrier.

A conventional tape carrier obtained by the above steps can be further processed by the steps comprising bonding the semiconductor-chip on the tape by the inner-lead bonder, cutting the outer-lead portion from the chips-bonded tape, and bonding the tape on a printed plate by outer-lead bonder followed by molding in the resin.

Alternatively, the above resulting tape can be processed by steps comprising molding the tape by resin after bonding the tips on the tape by inner-lead bonder, cutting the outer-lead portion and a part of the circuit adjusted to the outer-lead portion, and outer-lead bonding the tape.

However, the above conventional processes have some problems. That is, for example, it is difficult to remove the ionic impurities generated from the adhesive and organic-insulating films in the above processes of preparing the tape carrier. In the above processes, these ionic impurities are often contaminated by the molding resin, the adjacent circuit or the like, especially in the above steps of (3) to (5), and thus the above chip or an Al wire is corroded and the electrical-insulating reliability of the carrier is deteriorated.

The degree of the contamination mainly depends on a composition of the adhesive used for the adhesive tape for TAB. In the above steps of (3) to (5), the ionic impurities are not only generated from the adhesive itself but also from the steps of exposing the adhesive to alkaline (for example, $K^+$ ion in the gold-plating step or the resist-peeling step) or acidic solution (for example, Cl ion or $SH_4$ ion in the gold-plating step), etching solution (Cl ion), and the like.

Furthermore, the electrical-insulating reliability does not only depend on the ionic impurities but also depends on the humidity-thermal resistance, the electrical resistance and other properties of the adhesive.

The conventional adhesive used for the adhesive tape for TAB, mainly contains an epoxy resin as a thermosetting composition to improve several properties of the TAB tape, such as the electrical insulating reliability, the chemical resistance, and the thermal resistance thereof. However, the epoxy-type adhesive affects adhesion properties of the adhesive tape for TAB. Thus, the adhesive strength of the adhesive tape for TAB is decreased when the adhesive consists of epoxy resins. If the content of the thermosetting component is lowered, on the other hand, the adhesion property is improved in spite of the other properties mentioned above which are decreasing.

Accordingly, one of the objectives of the present invention is to solve the above problems and is to provide adhesive tape for TAB having improved properties of the electrical insulating reliability, the chemical resistance, the thermal resistance, and the adhesion strength properties.

Furthermore, the adhesive tape for TAB having the epoxy-type adhesive has a tendency to show some of the disadvantages including metal migration among the patterns in the above described process, and because of that (a) the epoxy-type adhesive has a tendency to generate ionic impurities such as Cl ion, (b) the epoxy-tape adhesive is easily hydrolysed under thermal-humidification, and (c) the epoxy-type adhesive has a low-electrical resistance.

In addition, a high-adhesion strength of the adhesive have been required enough to bond both the copper foil and the organic-insulating film, because the adhesive is applied between the copper foil and the organic-insulating film.

The conventional adhesive layer for the adhesive tape for TAB has been formed as a monolayer having following disadvantageous points:

(a) lowering the adhesion strength of the adhesive layer against the copper foil by subjecting the adhesive layer to an alkaline solution, for example, in the gold-plating step or the resist-removal step, to an acidic solution, for example, in the tin-plating step, to an etching solution or the like in the above described process; and also (b) lowering the adhesion strength of the adhesive layer against the organic insulating film at high temperatures in the process of inner-lead bonding and outer-lead bonding.

Although, the conventional adhesive layer shows the above disadvantages, there has recently been a remarkable improvement in the degree of integration of semiconductor elements and also miniaturization of semiconductors has been proceeding rapidly, resulting in that the number of lead frame pins has increased. Therefore, the conventional adhesive layer is difficult to endure inner and outer lead bonding processes and to keep laminating properties, and also it causes dimensional change of the TAB tapes or the tape carriers during the above process.

Accordingly, the adhesive tape for TAB having a conventional adhesive layer does not show an appropriate adhesion property which is responsible for enduring the inner-lead bonding and the outer-lead bonding, and for lowering dimensional change to suit devices having a high-pin count or a fine-pattern formation.

In order to overcome the defects of the conventional adhesive tapes, intensive investigation has been made by the present inventors on the relationship between the composition and various properties of the adhesive tapes.

DETAILED DESCRIPTION OF THE INVENTION

In a first preferred embodiment of the present invention, the adhesive tape for TAB is formed as a three-layer structure consisting of a protective film, an adhesive layer and an organic-insulating film. In this embodiment, the adhesive layer containing at least a polyamide resin and a resol-type phenol resin and the protective film are provided on the organic-insulating film. The first adhesive tape for TAB is characterized by that the resol-type phenol resin is contained in an amount of 2 to 35% in the adhesive layer.

FIG. 1 is a schematic cross-sectional view of an adhesive tape for TAB according to this invention. In this figure, a semi-hardened adhesive layer 2 is laminated on one surface of an organic-insulating film 1 and a protective film 3 is further laminated on the surface of the adhesive layer 2.

As the organic-insulating film, there can be used organic base films, more particularly heat resistant base films or composite heat resistant base films, which have a thickness of from 25 to 188 $\mu$m, preferably from 50 to 125 $\mu$m. The heat resistant base films are composed of polyimides, polyetheretherketones, polyetherimides, polyphenylene sulfides, or the like, while the composite heat resistant base films are composed of epoxy resin-glass cloths, epoxy resin-polyimide-glass cloths or the like.

The adhesive layer is a layer having a thickness of from 10 to 40 $\mu$m, preferably from 15 to 30 $\mu$m, and is composed of at least polyamide resin and resol-type phenol resin. Also, the adhesive layer must be a thermosetting-type layer which is in the condition of a semi-curing state.

The above polyamide resin is comprised in the adhesive layer for providing a high adhesion strength between the adhesive layer and the organic-insulating film and also providing an improved flexibility of the adhesive.

It is desired that the average molecular weight of the polyamide resin is in the range of 30,000–150,000 and the softening temperature thereof is in the range of 100°–180° C. The molecular weight of the polyamide resin is responsible for improving flexibility and melting properties of the adhesive, and for ensuring thermocompression bonding between the tape and the copper foil. For example, when the molecular weight of the polyamide resin is less than 30,000, the melting point of the adhesive becomes relatively low, and the adhesive is extruded from a device-hole during the step of hardening the adhesive or during the step of the thermocompression bonding between the tape and the copper foil. On the other hand, when it is more than 150,000, the thermocompression bonding between the tape and the copper foil requires relatively high temperatures.

Furthermore, other factors influencing the melting property of the polyamide resin, which is responsible for extruding the adhesive layer from the device-hole, is a molecular weight distribution of the polyamide resin. Therefore, it is desired that the molecular weight distribution of the polyamide resin covers a wide range. When the range of the molecular weight of the polyamide resin comprised in the adhesive layer is narrowly distributed, the range of the temperature used in the step of thermocompression bonding between the tape and the copper foil becomes narrow and the tape is easily subjected to the high temperature which causes rapid lowering of the viscosity of the adhesive layer.

The adhesive layer of this invention comprises a resol-type phenol resin which may be selected from a bisphenol A type resin, an alkylphenol type resin, or a co-condensed type resin, wherein phenol component thereof is one or two members selected from the group consisting of bisphenol A and alkylphenol.

As the resol-type phenol resin in which the phenol component is alkylphenol, there can be used those having an alkyl group mainly at the ortho- or para-position to the phenolic hydroxyl group. This alkyl group includes a methyl group, a ethyl group, a propyl group, a t-butyl group, a nonyl group, and the like.

When the above-described resol-type phenol resin is subjected under the high temperature, this resin may be changed to an insoluble and infusible solid material showing high adhesion strength. Therefore when the resol-type phenol resin is comprised in the adhesive, the resulting adhesive obtains reliability in insulation, chemical resistance, heat resistance and excellent adhesive force.

In the adhesive layer of the adhesive tape of this invention, the phenol component of the resol-type phenol resin may contain other phenol components such as novolak-type phenol which is typical of non-thermal reactive phenols, in particular, for example, one or two members selected from the group consisting of bisphenol A and alkylphenol, or co-condensed type of novolak-type phenol.

The adhesive layer needs to have thermosetting properties. Therefore, in the case where the non-thermal reactive phenolic resin is employed as the adhesive, an epoxy resin and an imidazole compound are blended therein. The epoxy resin reacts with the molecular chain terminal of the polyamide resin and is easily able to cure-react with the phenolic resin under the presence of the imidazole compound. Thus obtained cured product contributes to improving the chemical resistance and heat-resistance of the adhesive tape. The epoxy resin may include bisphenol A diglycidyl ether, epoxidated phenol novolak, epoxidated cresol novolak, or the like.

The imidazole compound includes 2-methylimidazole, 2-ethyl-4-methylimidazole, or the like which is dissolved in the conventional solvents such as methylethylketone; or 2-phenyl-4-benzyl-5-hydroxymethylimidazole, or the like which is slightly soluble in the conventional solvents.

According to the present invention, the resol-type phenolic resin must be present in the amount of 2% to 35% in the adhesive layer. In the case where the adhesive layer has the resol-type phenol resin of not more than 2%, the adhesive effect to the copper foil never appears. If the resol-type phenol resin is present in the amount of 35% or more, the chemical resistance, which is needed in the processing steps of the adhesive tape for TAB such as the etching step, cannot be sufficient.

The protective film functioning as the protective layer of the adhesive layer may include a polyester film such as polyethylene terephthalate.

Next, a method for manufacturing a first adhesive tape for TAB according to the present invention will be explained. FIG. 2 is a view showing the manufacturing steps thereof. The adhesive solution prepared by blending in a prescribed ratio of the components is laminated on the protective film 3 so that the thickness of the dried adhesive layer is in the range described above. In order to maintain a semi-cured state of the adhesive layer, the liquid adhesive laminated on the protective film 3 needs to be subjected to the heat-drying treatment at 150° C. to 180° C. for 2 minutes.

The organic-insulating film 1 is laid on the surface of thus obtained adhesive layer 2. The film 1 with the adhesive layer 2 is subjected to the thermocompression bonding treatment at 100° C. to 130° C. under the pressure of 1 Kg/cm$^2$ or more.

The obtained adhesive tape for TAB having, for example, the width of 30 mm to 200 mm and the length of 30 m to 300 m, is wound.

The adhesive tape for TAB according to the second preferred embodiment of the present invention is characterized in that the adhesive layer, which is formed between the organic-insulating film and the protective film, is composed of at least two layers; and that the layer attached to the organic insulating film has a polyamide resin as a principal ingredient, while the layer attached to the protective film has a polyamide resin and a resol-type phenol resin as a principal ingredient.

FIG. 3 is a schematic cross-sectional view of the adhesive tape for TAB of the present invention. On one side of the organic insulating film 1, the semi-cured adhesive layer 2 comprising the first adhesive layer 21 and the second adhesive layer 22 are stacked. The protective film 3 functioning as the protective layer is further stacked on the adhesive layer 2. Although the adhesive layer 2 has two layers in FIG. 3, further layers may be present therein.

The organic-insulating film has a thickness of 25 um to 188 um, preferably 50 um to 125 um. The organic insulating film may be composed of a heat-resistant film such as polyimide, polyether imide, polyphenylene sulfide, or polyether ether ketone; or a composite heat-resistant film such as epoxy resin-glass cloth, or epoxy resin-polyimide-glass cloth.

There is a need for the adhesive layer to be in a semi-cured state, and to have thermosetting properties. The adhesive layer comprises at least two layers. The total thickness of the adhesive layer is in the range of 10 $\mu$m to 50 $\mu$m, preferably 15 $\mu$m to 30 $\mu$m. In addition, each of the adhesive layer attached to the organic-insulating film and the adhesive layer attached to the protective film desirably has a thickness of at least 1 $\mu$m.

As the adhesive layer attached to the organic-insulating film, there is used an adhesive exhibiting a strong adhesion force with the organic-insulating film and having high viscosity at high temperatures. According to the present invention, such an adhesive includes a polyamide resin as a principal ingredient. The adhesive layer attached to the organic-insulating film can be used in combination with an epoxy resin or a novolak-type phenol resin. Furthermore, a thermoplastic resin such as a polyester resin, NBR, or SBR may be blended therein. In any cases, the polyamide resin is preferably present in 50% by weight or more in the total weight of the adhesive layer attached to the organic-insulating film.

On the other hand, as the adhesive layer attached to the protective film, there is used an adhesive having a strong adhesiveness to the copper foil and excellent chemical resistance to the agents employed during the processing step for processing a film carrier tape. In the present invention, the adhesive having a polyamide resin and a resol-type phenol resin as a principal ingredient is employed.

The resol-type phenol resin is present in the amount of preferably 4 parts by weight to 10 parts by weight per 100 parts by weight of the polyamide resin. In addition, the polyamide resin is included in the amount of less than 50% by weight in the total weight of the adhesive.

This adhesive layer can be employed in combination with a thermosetting resin such as an epoxy resin or a novolak-type phenol resin; and a curing accelerator such as imidazole.

All or any of the conventional polyamide resins can be used as the adhesive layers described above, according to the present invention.

The choice of the molecular weight of the employed polyamide resin depends on the flexibility of the adhesive tape, or melting properties during the curing step of the adhesive or the thermocompression bonding step for bonding the tape and the copper foil. If the molecular weight of the polyamide resin is too small, there is a disadvantage in that the adhesive can be easily extruded from the device hole because the melting temperature is lowered.

On the other hand, if the molecular weight is too large, the temperature of the thermocompression bonding with the copper foil is too increased.

It is desirable that the average molecular weight of the polyamide resin is in the range of 30,000 to 150,000 and that the softening temperature thereof is in the range of 100° C. to 180° C.

Furthermore, the factor influencing on melting properties of the polyamide resin, which is associated with the extruding the adhesive from the device hole, is a molecular weight distribution thereof. In the case where the distribution of the molecular weight of the polyamide resin is in a small range, the range of the temperature for thermocompression bonding between the tape and the copper foil becomes narrowed and the viscosity is rapidly lowered due to high temperature. Therefore, the polyamide resin employed in the present invention is preferably in a wide range of the molecular weight distribution.

In addition, in the case where the polyamide resin having, for example, an amide group equivalent (molecular weight/oneamide group) of in the range of 200 to 400 is employed, the hygroscopic nature of the adhesive layer is decreased. For this reason, the value of lowering the electrical resistance due to the hygroscopic can be controlled around one order of magnitude. Therefore, such polyamide resin is preferable since hygroscopic resistance is improved and the insulation deterioration can be avoided.

In addition, the polyamide resin may be used wherein the molecular weight of the hydrocarbons between the amide groups in one molecular chain of the polyamide resin is in the range of 100 to 800; or wherein the hydrocarbons between the amide groups in one molecular chain of the polyamide resin having different molecular weights are irregularly located. These polyamide resins are preferably employed since they have adhesiveness and superior flexibility in spite of their amide group equivalents being large.

The resol-type phenol resin used in combination with the polyamide resin described above may include a bisphenol A type resin, an alkylphenol type resin, or a co-condensed type resin, wherein the phenol component thereof is one or two members selected from the group consisting of bisphenol A and alkylphenols. The alkylphenol type of the resol-type phenol resin has a methyl group, an ethyl group, a propyl group, a t-butyl group, a nonyl group, or the like at the ortho- or paraposition of the phenolic hydroxyl group. After the resol-type phenol resin is reacted by heat, the resin becomes an insoluble and infusible solid material and contributes to improving the adhesion force, insulating properties, chemical resistance, and heat resistance of the adhesive.

The protective film for the adhesive layer may include a polyethylene film, a polyethylene terephthalate film, a polypropylene film or the like.

Next, the method for manufacturing the second adhesive tape for TAB according to the present invention will be explained. FIG. 4 is a view showing its manufacturing steps. Two adhesive solutions, prepared by blending in the prescribed ratios of the components, are laminated on the protective film 3 so that the thickness of each of the first dried adhesive layer 21 and the second dried adhesive layer 22 is in the range described before. Two films coated by the first adhesive layer and the second adhesive layer respectively may be stacked on the protective film 3 by compression bonding. In order to maintain a semi-cured state of the adhesive layer, the liquid adhesive is subjected to the heat-drying treatment at 150° C. to 180° C.

Next, the organic insulating film 1 is laid on the surface of thus obtained adhesive layer 2. The film 1 with the adhesive layer 2 is subjected to the thermocompression bonding treatment at 100° C. to 130° C. under the pressure of 1 Kg/cm² or more.

The obtained adhesive tape for TAB having, for example, the width of 30 mm to 200 mm and the length of 30 m to 300 m, is wound.

DESCRIPTION OF PREFERRED EMBODIMENTS

Figure 1:
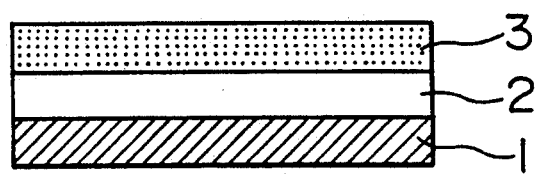
FIG. 1 is a schematic cross-sectional view of the adhesive tape for TAB according to the first preferred embodiment of this invention.
Figure 2:
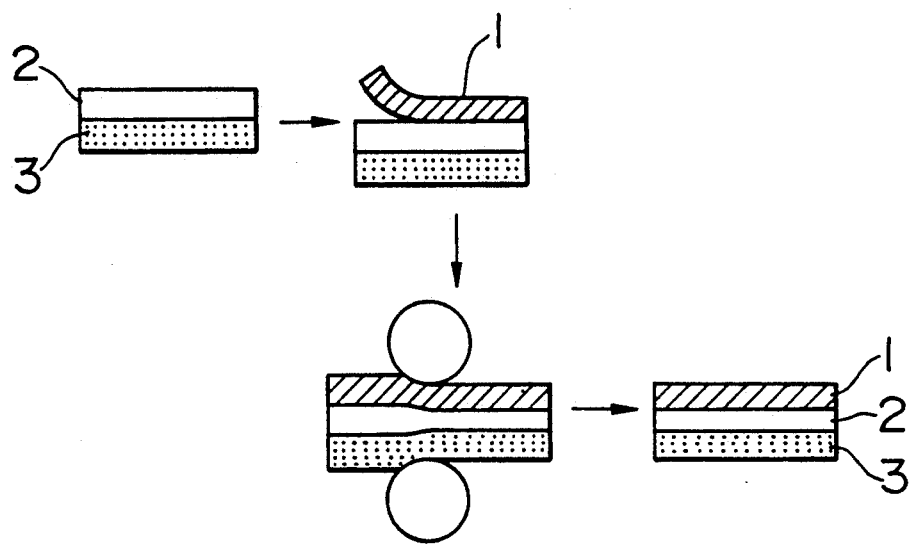
FIG. 2 is a flow sheet illustrating the process of manufacturing the adhesive tape for TAB according to the first preferred embodiment of this invention.
Figure 3:
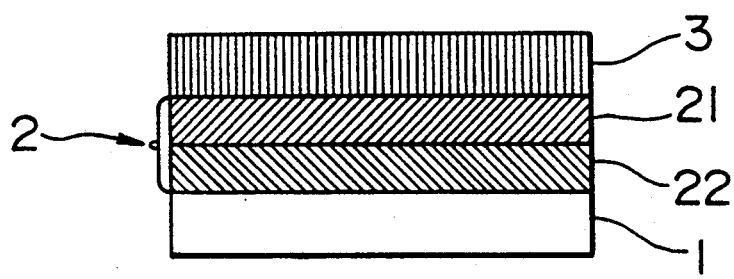
FIG. 3 is a schematic cross-sectional view of the adhesive tape for TAB according to the second preferred embodiment of this invention.
Figure 4:
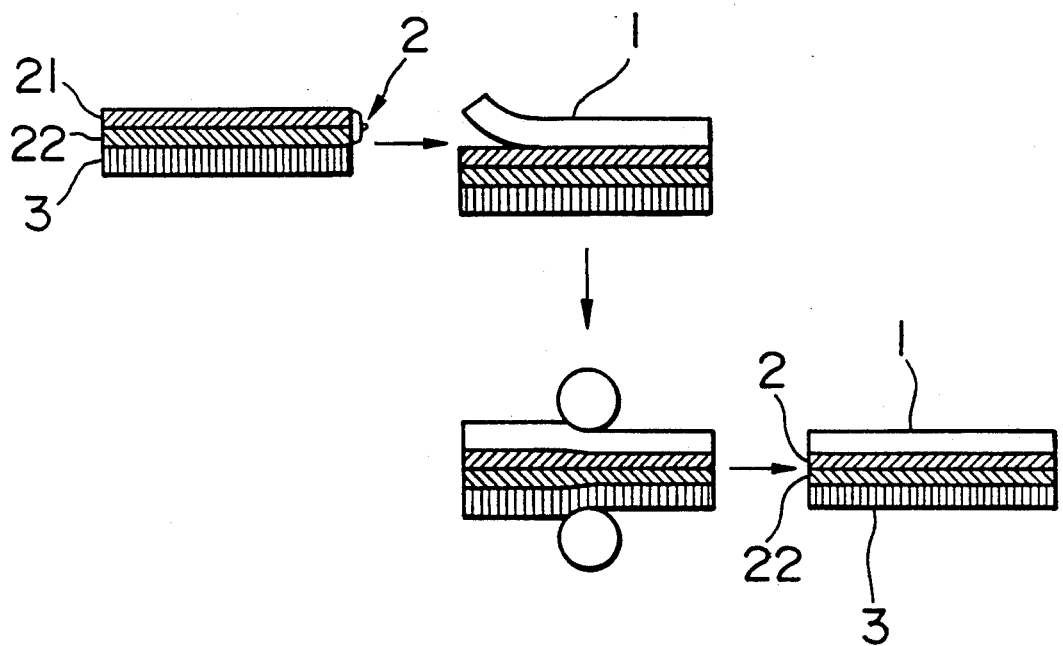
FIG. 4 is a flow sheet illustrating the process of manufacturing the adhesive tape for TAB according to the second preferred embodiment of this invention.

Hereinafter, the first preferred embodiment of this invention will be described in detail with reference to the attached drawings.

Unless otherwise indicated specifically, all parts and percentages are by weight.

EXAMPLE 1

An adhesive mixture comprising the following compositions was coated on one surface of a protective film consisting of a polyethylene terephthalate film having a thickness of 38 μm, and dried at 160° C. for 2 minutes to prepare a adhesive layer of 20 μm thickness.

Compositions of the adhesive mixture:

100 parts of 25% polyamide resin ("Tomaido TXC-232-B", produced by Fuji Kasei Kogyo Co., Ltd.) in isopropylalcohol/water mixture solution;

8 parts of epoxy resin ("Epikote 828", produced by Yuka Shell Epoxy Co., Ltd.);

8 parts of 50% novolac-type phenol resin ("Tamanolu 752", produced by Arakawa Kagaku Co., Ltd.) in methylethylketone solution;

6 parts of 50% resol-type phenol resin ("CKM-1282" Showa Kobunshi Co., Ltd.) in methylethylketone solution; and 10 parts of 1% 2-ethylimidazole in methylethylketone solution.

After that, an organic-insulating film of polyimide film having a thickness of 50 μm was laminated on a surface of the adhesive layer which is coated on the protective film, and the layers were pressurized at a temperature of 130° C. and a pressure of 1 kg/cm² to prepare a adhesive tape for TAB according to this invention.

The protective film was removed from the resulting adhesive tape for TAB and one ounce of electrolyte copper foil of 35-40 μm thickness was laminated on the removed portion of the adhesive tape, and pressurized at a temperature of 130° C. and a pressure of 1 kg/cm², followed by subsequent heating treatments at a temperatures of 60° C. for 6 hours, 80° C. for 6 hours, 120° C. for 3 hours and 150° C. to harden the adhesive layer in the copper-foil laminated tape. After the hardening step, a photoresist was coated on the tape by the conventional method as described above and an arched circuit was formed on the copper-foil laminated tape by etching of the copper foil to obtain a tape carrier.

EXAMPLE 2

An adhesive tape for TAB and a tape carrier are obtained by the same procedure as in Example 1 except that the following compositions were used for preparing the adhesive mixture.

Compositions of the adhesive mixture:

60 parts of 25% polyamide resin ("Tomaido TXC-232-B", produced by Fuji Kasei Kogyo Co., Ltd.) in isopropylalcohol/water mixture solution;

14 parts of epoxy resin ("Epikote 828", produced by Yuka Shell Epoxy Co., Ltd.);

14 parts of 50% novolac-type phenol resin ("Tamanolu 752", produced by Arakawa Kagaku Co., Ltd.) in methylethylketone solution;

6 parts of 50% resol-type phenol resin ("CKM-1282" Showa Kobunshi Co., Ltd.) in methylethylketone solution; and 10 parts of 1% 2-ethylimidazole in methylethylketone solution.

EXAMPLE 3

An adhesive tape for TAB and a tape carrier are obtained by the same procedure as in Example 1 except that the following compositions were used for preparing the adhesive mixture.

Compositions of the adhesive mixture:

60 parts of 25% polyamide resin ("Tomaido TXC-232-B", produced by Fuji Kasei Kogyo Co., Ltd.) in isopropylalcohol/water mixture solution;

14 parts of epoxy resin ("Epikote 828", produced by Yuka Shell Epoxy Co., Ltd.);

14 parts of 50% novolac-type phenol resin ("Tamanolu 752", produced by Arakawa Kagaku Co., Ltd.) in methylethylketone solution;

6 parts of resol-type phenol resin ("PR-11078" Sumitomo Durezu Co., Ltd.); and 10 parts of 1% 2-ethylimidazole in methylethylketone solution.

COMPARATIVE EXAMPLE 1

An adhesive tape for TAB and a tape carrier are obtained by the same procedure as in Example 1 except that the following compositions were used for preparing the adhesive mixture.

Compositions of the adhesive mixture:

100 parts of 25% polyamide resin ("Tomaido TXC-232-B", produced by Fuji Kasei Kogyo Co., Ltd.) in isopropylalcohol/water mixture solution;

10 parts of epoxy resin ("Epikote 828", produced by Yuka Shell Epoxy Co., Ltd.);

10 parts of 50% novolac-type phenol resin ("Tamanolu 752", produced by Arakawa Kagaku Co., Ltd.) in methylethylketone solution; and 10 parts of 1% 2-ethylimidazole in methylethylketone solution.

COMPARATIVE EXAMPLE 2

An adhesive tape for TAB and a tape carrier are obtained by the same procedure as in Example 1 except that the following compositions were used for preparing the adhesive mixture.

Compositions of the adhesive mixture:

60 parts of 25% polyamide resin ("Tomaido TXC-232-B", produced by Fuji Kasei Kogyo Co., Ltd.) in isopropylalcohol/water mixture solution;

16 parts of epoxy resin ("Epikote 828", produced by Yuka Shell Epoxy Co., Ltd.);

16 parts of 50% novolac-type phenol resin ("Tamanolu 752", produced by Arakawa Kagaku Co., Ltd.) in methylethylketone solution; and 10 parts of 1% 2-ethylimidazole in methylethylketone solution.

COMPARATIVE EXAMPLE 3

An adhesive tape for TAB and a tape carrier are obtained by the same procedure as in Example 1 except that the following compositions were used for preparing the adhesive mixture.

Compositions of the adhesive mixture:

100 parts of 25% polyamide resin ("Tomaido TXC-232-B", produced by Fuji Kasei Kogyo Co., Ltd.) in isopropylalcohol/water mixture solution;

8 parts of epoxy resin ("Epikote 828", produced by Yuka Shell Epoxy Co., Ltd.);

8 parts of 50% novolac-type phenol resin ("Tamanolu 752", produced by Arakawa Kagaku Co., Ltd.) in methylketone solution;

60 parts of resol-type phenol resin ("PR-11078" Sumitomo Durezu Co., Ltd.); and 10 parts of 1% 2-ethylimidazole in methylethylketone solution.

Tape carriers obtained by the procedures of Examples 1-3 and Comparative Examples 1-3 are subjected to the following tests.

1. Short-circuit test:

A short-circuit test was applied to a pattern of 100 μm linear-length between two ends thereof under the conditions of 100 volts of the applied voltage at 121° C., 2 atm.

The time required to produce shorting was measured.

2. Chemical-resistance test:

Heating the tape carrier to harden the composition of the adhesive layer, followed by immersing the tape carrier in acetone or methanol solution under ultrasonic agitation at 30° C. for 1 hour. After that, a percent of reduced weight of the tape carrier was measured.

3. 180° peeling test:

The sample was adjusted to a size of 1 cm in width.

The 180° peeling strength between the adhesive layer and the cooper foil was measured using a universal testing machine.

The results of these tests are shown in Table 1 below.

TABLE 1

|   | Examples | | | Comparative Examples | | |
|---|---|---|---|---|---|---|
|   | 1 | 2 | 3 | 1 | 2 | 3 |
| 1. Short-circuit time (hrs) | 217 | 250 | 241 | 104 | 125 | 250 |
| 2. Chemical resistance | | | | | | |
| Acetone (%) | 2.0 | 1.7 | 1.6 | 4.0 | 3.2 | 3.8 |
| Methanol (%) | 2.3 | 1.6 | 1.6 | 5.2 | 3.2 | 4.0 |
| 3. Adhesive strength (kg/cm) | 2.5 | 2.4 | 2.4 | 2.5 | 1.4 | 2.5 |

The results shown in Table 1 clearly indicate that the adhesive tapes for TAB according to the first preferred embodiment of this invention show excellent insulation characteristics, chemical resistance, and high adhesive strength, compared with the comparative tapes.

As mentioned above, there has recently been a remarkable improvement in the degree of integrity of semiconductor elements and also miniaturization of semiconductors has been proceeding rapidly. Consequently, that the number of lead frame pins has increased and the respective inner-lead pins have become thinner and more crowded. However, as will be clear from the results in Table 1 above, the adhesive tapes for TAB according to the first preferred embodiment of this invention can be provided for fixing the lead frames with sufficient insulation properties between the inner-lead pins with the accuracy of the positioning of the respective pins. Therefore, the novel adhesive tapes for TAB according to this invention can remain between inner lead pins in spite of increasing the number of lead frame pins. That is, the TAB tapes according to this invention will contribute to avoid deviation of the positions of the inner lead pins and to increase in the efficiency of the wire bonding step during the assembly procedure of manufacturing semiconductor elements having respectively a large number of lead pins.

The adhesive tapes for TAB according to the second preferred embodiment of this invention will be described in detail with reference to the following examples.

EXAMPLE 4

An adhesive mixture comprising following compositions was coated on one surface of a protective film of a polyethylene terephthalate film having a thickness of 38 μm, and dried at 160° C. for 2 minutes to prepare a adhesive layer having 15 μm.

Compositions of the adhesive mixture:

60 parts of 25% polyamide resin ("Tomaido TXC-232-B", produced by Fuji Kasei Kogyo Co., Ltd.) in isopropylalcohol/water mixture solution;

6 parts of 50% resol-type phenol resin ("CKM-1282" Showa Kobunshi Co., Ltd.) in methylethylketone solution;

14 parts of epoxy resin ("Epikote 828", produced by Yuka Shell Epoxy Co., Ltd.);

14 parts of 50% novolac-type phenol resin ("Tamanolu 752", produced by Arakawa Kagaku Co., Ltd.) in methylethylketone solution; and 10 parts of 1% 2-ethylimidazole in methylethylketone solution.

Next, an adhesive mixture comprising following compositions was coated on the above adhesive layer and dried at 160° C. for 2 minutes to prepare a adhesive layer having a thickness of 5 μm.

Compositions of the adhesive mixture:

100 parts of 25% polyamide resin ("Tomaido TXC-232-B", produced by Fuji Kasei Kogyo Co., Ltd.) in isopropylalcohol/water mixture solution;

8 parts of epoxy resin ("Epikote 828", produced by Yuka Shell Epoxy Co., Ltd.);

8 parts of 50% novolac-type phenol resin ("Tamanolu 752", produced by Arakawa Kagaku Co., Ltd.) in methylethylketone solution; and 10 parts of 1% 2-ethylimidazole in methylethylketone solution.

After that, an organic-insulating film of a 50 μm thick polyimide film was laminated on a surface of the adhesive layer which is coated on the protective film, and the layers were pressurized at a temperature of 130° C. and a pressure of 1 kg/cm$^2$ to prepare an adhesive tape for TAB according to this invention.

The protective film was peeled off from the resulting TAB tape and one ounce of electrolytic copper foil of 35–40 μm thickness was laminated on the peeled portion of the tape, and pressurized at a temperature of 130° C. and a pressure of 1 kg/cm$^2$, followed by subsequent heating treatments at temperatures of 60° C. for 6 hours, 80° C. for 6 hours, 120° C. for 3 hours and 150° C. to harden the adhesive layer in the copper-foil laminated tape. After the hardening step, a photoresist was coated on the tape by the conventional method as described above and an arched circuit was formed on the copper-foil laminated tape by etching of the copper foil to obtain a tape carrier.

EXAMPLE 5

An adhesive tape for TAB and a tape carrier obtained by the same procedure as in Example 4 except that the following compositions were used for preparing the adhesive mixture.

Compositions of the adhesive on the side of the protective layer:

60 parts of 25% polyamide resin ("Macromelt 6212", produced by Henkel Hakusui Co., Ltd.) in isopropylalcohol/water mixture solution;

6 parts of 50% resol-type phenol resin ("CKM-1282" Showa Kobunshi Co., Ltd.) in methylethylketone solution;

14 parts of epoxy resin ("Epikote 828", produced by Yuka Shell Epoxy Co., Ltd.);

14 parts of 50% novolac-type phenol resin ("Tamanolu 752", produced by Arakawa Kagaku Co., Ltd. ) in methyethyllketone solution; and 10 parts of 1% 2-ethylimidazole in methylethylketone solution.

Compositions of the adhesive on the side of the organic insulating film:

100 parts of 25% polyamide resin ("Macromelt 6212", produced by Henkel Hakusui Co., Ltd.) in isopropylalcohol/water mixture solution;

8 parts of epoxy resin ("Epikote 828", produced by Yuka Shell Epoxy Co., Ltd.);

8 parts of 50% novolac-type phenol resin ("Tamanolu 752", produced by Arakawa Kagaku Co., Ltd.) in methylethylketone solution; and 10 parts of 1% 2-ethylimidazole in methylethylketone solution.

EXAMPLE 6

An adhesive tape for TAB and a tape carrier obtained by the same procedure as in Example 4 except that the following compositions were used for preparing the adhesive mixture.

Compositions of the adhesive on the side of the protective layer:

60 parts of 25% polyamide resin ("Platabonda M-1276", produced by Nippon Lirusan Co., Ltd.) in isopropylalcohol/water mixture solution;

6 parts of 50% resol-type phenol resin ("PR-11078" Sumitomo Durezu Co., Ltd.) in methylethylketone solution;

14 parts of epoxy resin ("Epikote 828", produced by Yuka Shell Epoxy Co., Ltd.);

14 parts of 50% novolac-type phenol resin ("Tamanolu 752", produced by Arakawa Kagaku Co., Ltd.) in methylethylketone solution; and 10 parts of 1% 2-ethylimidazole in methylethylketone solution.

Compositions of the adhesive on the side of the organic-insulating film:

100 parts of 25% polyamide resin ("Platabonda M-1276", produced by Nippon Lirusan Co., Ltd.) in isopropylalcohol/water mixture solution;

8 parts of epoxy resin ("Epikote 828", produced by Yuka Shell Epoxy Co., Ltd.);

8 parts of 50% novolac-type phenol resin ("Tamanolu 752", produced by Arakawa Kagaku Co., Ltd.) in methylethylketone solution; and 10 parts of 1% 2-ethylimidazole in methylethylketone solution.

COMPARATIVE EXAMPLE 4

An adhesive tape for TAB and a tape carrier are prepared by the method as shown in Example 4 except that the following compositions were used for preparing the adhesive mixture and an adhesive layer is formed as a mono-layer.

100 parts of 25% polyamide resin ("Tomaido TXC-232-B", produced by Fuji Kasei Kogyo Co., Ltd.) in isopropylalcohol/water mixture solution;

1 part of 50% resol-type phenol resin ("PR-11078" Sumitomo Durezu Co., Ltd.) in methylethylketone solution;

14 parts of epoxy resin ("Epikote 828", produced by Yuka Shell Epoxy Co., Ltd.);

14 parts of 50% novolac-type phenol resin ("Tamanolu 752", produced by Arakawa Kagaku Co., Ltd.) in methylethylketone solution; and 10 parts of 1% 2-ethylimidazole in methylethylketone solution.

COMPARATIVE EXAMPLE 5

An adhesive tape for TAB and a tape carrier are prepared by the method as shown in Example 4 except that the following compositions were used for preparing the adhesive mixture and an adhesive layer is formed as a mono-layer.

100 parts of 25% polyamide resin ("Platabonda M-1276", produced by Nippon Lirusan Co., Ltd.) in isopropylalcohol/water mixture solution;

8 parts of epoxy resin ("Epikote 828", produced by Yuka Shell Epoxy Co., Ltd.);

8 parts of 50% novolac-type phenol resin ("Tamanolu 752", produced by Arakawa Kagaku Co., Ltd.) in methylethylketone solution; and 10 parts of 1% 2-ethylimidazole in methylethylketone solution.

PROPERTIES EVALUATION TESTS

The tape carriers obtained by the above Examples 4-6 and Comparative examples 4-5 of the second preferred embodiment of the present invention are subjected to the following evaluation tests.

1. Chemical-resistance test:

The adhesive strength between the adhesive layer and the copper foil before and after immersing the tape carriers in an etching solution was measured, and after which the tests were repeated using an electroless plating solution.

The copper-foil patterns were adjusted to a size of 200, 100 and 50 μm in width, respectively. The adhesive strength of the each pattern was measured before immersing them in the chemical solution.

After that, the copper-foil patterns were immersed in the etching solution and then their adhesive strength after the immersing were measured.

After immersing the copper-foil patterns in the etching solution, they were also immersed in the electroless plating solution and then their adhesive strength after the immersing was measured.

The results are shown in Table 2 below. In the table, each measurement was obtained by subjecting the samples to the 180° peeling test using a universal testing machine, a tensile strength measuring device "Tensilon".

2. Heat-resistance test:

A free surface of an organic insulating film of the tape carriers having a copper foil of 1 cm width was bonded on a surface of the heating plate at 35° C. After the fixing, the copper foil was peeled off to the direction of 180° at a peeling speed of 5 cm/minutes and the peeling strength for this process was measured. The results were shown in Table 3 below.

TABLE 2

| | Width of the copper-foil pattern (μm) | | |
|---|---|---|---|
| | 200 | 100 | 50 |
| Example 4 | | | |
| after the etching | 30.6 (g) | 14.8 (g) | 7.8 (g) |
| after the plating | 30.6 | 14.4 | 7.4 |
| Example 5 | | | |
| after the etching | 37.4 | 17.8 | 7.4 |
| after the plating | 38.4 | 17.8 | 7.5 |
| Example 6 | | | |
| after the etching | 37.8 | 18.2 | 8.5 |
| after the plating | 37.8 | 12.5 | 7.9 |

TABLE 2-continued

| | Width of the copper-foil pattern (μm) | | |
|---|---|---|---|
| | 200 | 100 | 50 |
| Comparative Example 4 | | | |
| after the etching | 29.0 | 12.5 | 6.9 |
| after the plating | 27.5 | 13.0 | 6.2 |
| Comparative Example 5 | | | |
| after the etching | 30.6 | 14.0 | 7.2 |
| after the plating | 20.6 | 7.5 | 3.0 |

TABLE 3

| | peeling strength (g/cm) |
|---|---|
| Example 4 | 300 |
| Example 5 | 340 |
| Example 6 | 290 |
| Comparative Example 4 | 50 |
| Comparative Example 5 | 280 |

As will be clear from the results in Table 2 and Table 3 above, the adhesive tape for TAB according to the present invention exhibits sufficient chemical resistant and heat resistant adhesion properties as compared with the comparative one.

The adhesive tape for TAB of the second preferred embodiment of this invention has at least two adhesive layers i.e., the one is laminated on an organic insulating film and the other is laminated on a protective film. These adhesive layers comprise the above described compositions which are responsible for maintaining the adhesive strength between the copper foil and the adhesive layer during the steps of etching, plating, resist formation and the like, especially during immersing in alkali or acidic, etching, and plating solutions.

Therefore, the novel adhesive tape for TAB according to this invention can remain between inner lead pins in spite of increasing the number of lead frame pins. That is, the adhesive tape for TAB according to this invention will contribute to avoiding deviation of the positions of the inner lead pins and to increase in the efficiency of the wire bonding step during the assembly procedure of manufacturing semiconductor elements having respectively a large number of lead pins.

We claim:

1. An adhesive tape for tape automated bonding (TAB), comprising a protective film and an adhesive layer laminated on an organic-insulating film, wherein said adhesive layer comprises at least two layers:
   one layer comprising at least a polyamide resin which is laminated on one surface of said organic-insulating film; and
   another layer comprising at least a polyamide resin and a resol-type resin which is laminated on a surface of said protective film.

2. An adhesive tape as claimed in claim 1, wherein the amount of said polyamide resin in said adhesive layer on one surface of said organic-insulating film is more than 50% by weight.

3. An adhesive tape as claimed in claim 1 or 2, wherein the amount of said polyamide resin in said adhesive layer on one surface of said protective film is less than 50% by weight.

* * * * *